(12) United States Patent
Dolazza et al.

(10) Patent No.: US 7,113,120 B1
(45) Date of Patent: Sep. 26, 2006

(54) CHARGE TRANSFER SYSTEM AND METHOD

(75) Inventors: Enrico Dolazza, Boston, MA (US); Hans J. Weedon, Salem, MA (US)

(73) Assignee: Analogic Corporation, Peabody, MA (US)

( * ) Notice: Subject to any disclaimer, the term of this patent is extended or adjusted under 35 U.S.C. 154(b) by 0 days.

(21) Appl. No.: 10/894,822

(22) Filed: Jul. 19, 2004

(51) Int. Cl.
 *H03M 3/00* (2006.01)
(52) U.S. Cl. .................. 341/143; 341/141; 341/150; 378/19; 378/114
(58) Field of Classification Search .............. 378/9, 378/11, 12, 14, 114; 341/150
See application file for complete search history.

(56) References Cited

U.S. PATENT DOCUMENTS

| | | | | |
|---|---|---|---|---|
| 4,484,340 A | * | 11/1984 | Yamaguchi et al. | 378/19 |
| 4,769,827 A | * | 9/1988 | Uno et al. | 378/19 |
| 5,323,439 A | * | 6/1994 | Nobuta et al. | 378/19 |
| 5,345,491 A | * | 9/1994 | Bolk et al. | 378/70 |
| 5,724,037 A | * | 3/1998 | Lee | 341/143 |
| 6,252,531 B1 | * | 6/2001 | Gordon et al. | 341/143 |

\* cited by examiner

*Primary Examiner*—Rexford Barnie
*Assistant Examiner*—Khai M. Nguyen
(74) *Attorney, Agent, or Firm*—McDermott Will & Emery LLP

(57) ABSTRACT

A charge transfer system includes a current-based input device for generating an input current signal, a temporary energy storage device, and an amplification device. A switching device couples the temporary energy storage device to the current-based input device during a first portion of a time period and to the amplification device during a second portion of a time period. The input current signal charges the temporary energy storage device, during the first portion of the time period, to generate an input voltage signal. The amplification device receives the input voltage signal during the second portion of the time period.

27 Claims, 4 Drawing Sheets

CHARGE TRANSFER SYSTEM AND METHOD

RELATED APPLICATIONS

The following U.S. patent is hereby incorporated by reference into the subject application as if set forth herein in full: (1) U.S. Pat. No. 6,252,531, entitled "Data acquisition system using delta-sigma analog-to-digital signal converters".

FIELD OF THE INVENTION

This invention relates to charge transfer systems and, more particularly, to charge transfer systems for use with imaging systems.

BACKGROUND

Certain signal processing systems simultaneously detect a plurality of analog information signals. Examples of these types of systems include computerized axial tomography (hereinafter "CT") scanners that are used to image the internal features of an object (e.g., a human body) by exposing the object to a preselected amount and type of radiation.

For example, certain CT scanners (called third generation scanners) typically include an X-ray source and an X-ray detector system secured respectively on diametrically-opposed sides of an annular-shaped disk, which is rotatable within a gantry support. The X-ray detector system includes an array of detectors. During a scanning procedure, the object being scanned is positioned within an opening of the annular-shaped disk (which continuously rotates about an axis of rotation), and X-rays pass from the X-ray source through the object and to the X-ray detector system.

In one type of system, the signals generated by the X-ray detector system are typically provided to the summing node input of an array of delta-sigma converters, such as the delta-sigma converters described in U.S. Pat. No. 6,252,531, entitled "Data acquisition system using delta-sigma analog-to-digital signal converters".

One type of X-ray detector system includes an array of detectors positioned as a single row or multiple rows in the shape of an arc of a circle or surface of a sphere having a center of curvature at the point (i.e., the "focal spot") where the radiation emanates from the X-ray source. The X-ray source and array of X-ray detectors are all positioned so that the X-ray paths between the source and each detector all lie in the same plane (i.e., the "slice plane" or "scanning plane") or planes which are substantially normal to the rotation axis of the annular-shaped disk.

The X-rays that are detected by a single X-ray detector at a measuring instant during a scan is considered a "ray." Because the ray paths originate from substantially a point source and extend at different angles to the detectors, the ray paths resemble a fan or cone, and thus the terms "fan" beam or "cone" beam are frequently used to describe all of the ray paths at any one instant of time. As a ray passes through the object being scanned, it is partially attenuated, thus generating a single intensity measurement as a function of the attenuation (i.e., the density of the mass in that path).

In other types of CT scanners (referred to as fourth generation scanners), the detection system comprises a circular array of detectors secured on and at equiangular positions around the gantry support, equidistant from the center of rotation of the disk, such that the source rotates relative to the detectors. For these scanners, the fan beam is defined as the ray paths from the rotating source to each detector where the point of convergence of each fan beam is the corresponding detector.

There are various types of detectors used in CT scanners, including solid state detectors (e.g., cadmium tungstate detectors, each of which includes a scintillation crystal or layer of ceramic material and a photodiode) and gas-type detectors (e.g., Xenon detectors). The X-ray source may provide a continuous wave or a pulsed X-ray beam.

Unfortunately, these detectors typically have a large detector diode capacitance (i.e., 50–200 picofarads). Since it is desirable to reduce the power consumption in multichannel CT scanners (which typically include 50,000–60,000 channels), this high capacitance proves problematic when coupling detectors to the summing node input of a delta-sigma converter. Specifically, this high detector capacitance results in a high gain-bandwidth product and, therefore, an unacceptably high (i.e.,>one milliwatt) per-channel power consumption.

SUMMARY OF THE INVENTION

In one implementation, a charge transfer system includes a current-based input device for generating an input current signal, a temporary energy storage device, and an amplification device. A switching device couples the temporary energy storage device to the current-based input device during a first portion of a time period and to the amplification device during a second portion of a time period. The input current signal charges the temporary energy storage device, during the first portion of the time period, to generate an input voltage signal. The amplification device receives the input voltage signal during the second portion of the time period.

One or more of the following features may also be included. The current-based input device may be a photodiode, which may be incorporated into a detector array of a computerized axial tomography scanner. The current-based input device may be a high-capacitance input device, and may have a capacitance in the range of 50–200 picofarads.

The capacitance of the temporary energy storage device may be less than the capacitance of the high-capacitance input device. The temporary energy storage device may be a capacitor.

The amplification device may be a delta-sigma converter, and the delta-sigma converter may be incorporated into a computerized axial tomography scanner. The switching device may be a solid-state switching device.

In another implementation, one or more additional amplification devices are included, and the switching device is configured to couple the temporary energy storage device to the current-based input device during a first portion of a time period and to the amplification devices during a second portion of a time period.

In another implementation, a method of reducing the gain-bandwidth product, in a computerized axial tomography scanner, includes generating an input current signal with a current-based input device. The current-based input device is coupled to a temporary energy storage device. The temporary energy storage device is charged, during a first portion of a time period, with the input current signal to generate an input voltage signal. The current-based input device is uncoupled from the temporary storage device. The temporary energy storage device is coupled to an amplification device. The input voltage is received on the amplification device during a second portion of the time period.

The details of one or more implementations are set forth in the accompanying drawings and the description below. Other features and advantages will become apparent from the description, the drawings, and the claims.

DETAILED DESCRIPTION OF THE PREFERRED EMBODIMENTS

Figure 1:
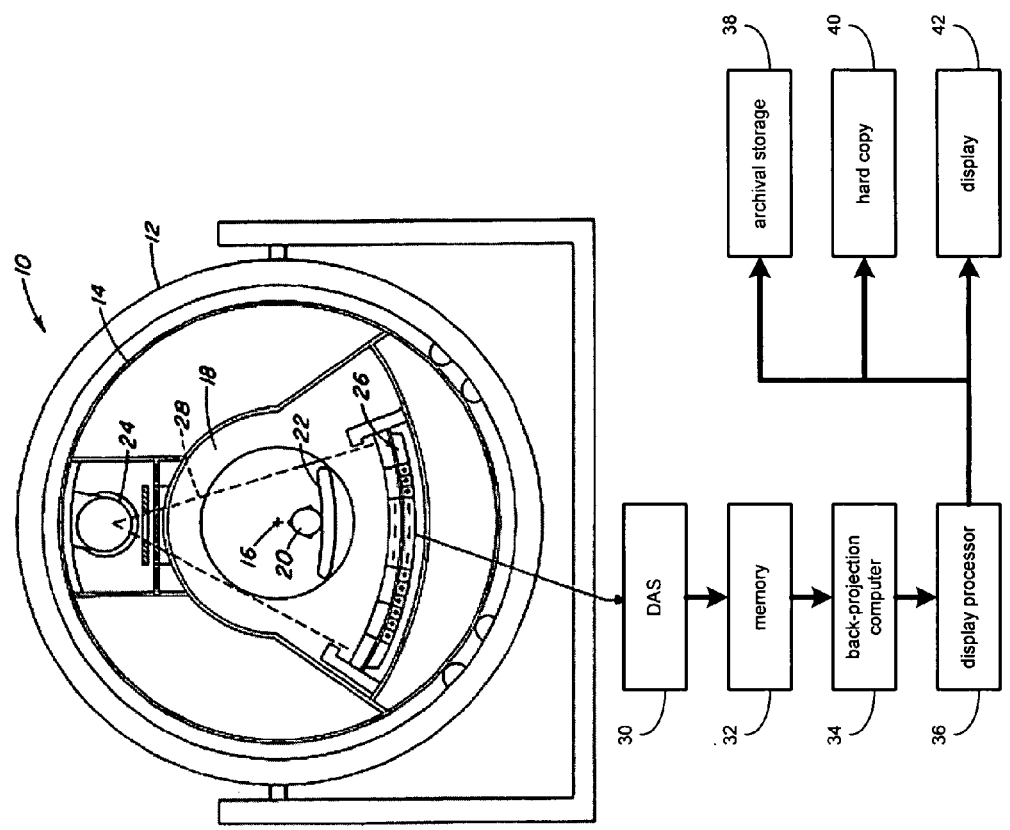
FIG. 1 is a diagrammatic end view of a CT scanning system.

Referring to FIG. 1, there is shown the typical elements of the third generation type of multi-channel CT scanner. The CT scanner 10 comprises a gantry including a gantry support frame 12 for rotatably supporting an annular disk 14 about an axis of rotation 16. The disk 14 has an opening 18 for receiving the object 20 to be scanned (e.g., a patient), the object typically being supported on a pallet/cantilevered table 22. The disk 14 supports an X-ray source 24 and detector array 26 on diametrically-opposed sides of opening 18. The beam 28 created by the source 24 is directed toward the detector array 26. The detector array includes a plurality of individual X-ray detectors, each of which provides a data signal to a channel of a multi-channel data acquisition system 30 (hereinafter DAS). The data received from the detector array 26 is processed by DAS 30 and stored in memory 32. A back projection computer 34 is adapted to process the data in a well-known manner using well-known algorithms so that the data is provided to a display processor 36 for archival storage 38, for providing a hard copy 40, and/or for displaying on a console 42.

Figure 2:
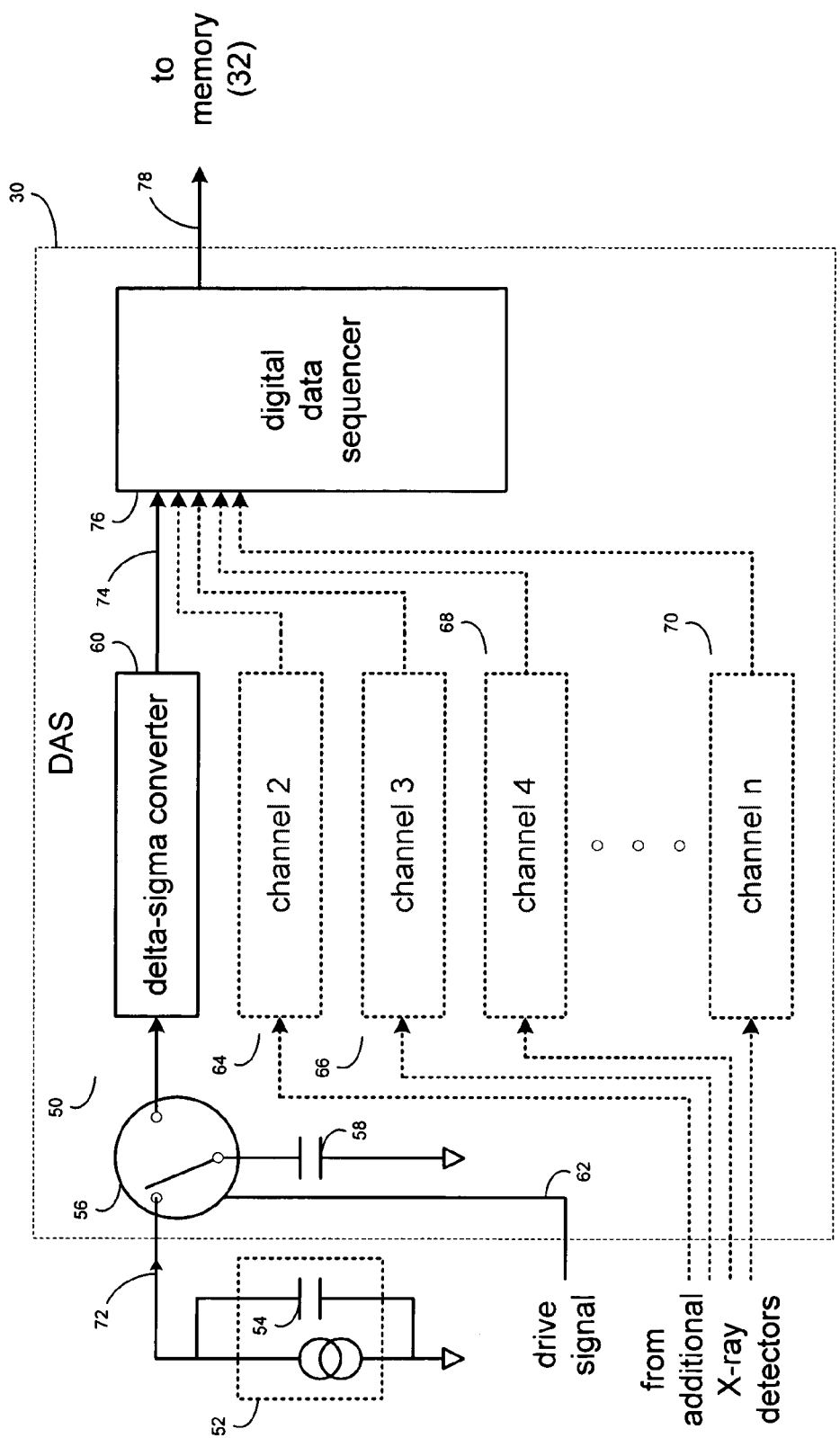
FIG. 2 is a block diagram of a single-amplifier channel of a data acquisition system of the CT scanning system of FIG. 1.

Referring also to FIG. 2, there is shown a more-detailed view of a single channel 50 of DAS 30. As discussed above, detector array 26 includes a plurality of individual current-based X-ray detectors (e.g., X-ray detector 52), each of which provides an analog data (current) signal to one channel of DAS 30. Detector 52, whose characteristics include an inherent capacitance 54, typically range in detector area from a one square millimeter detector having a capacitance of fifty picofarads to a four square millimeter detector having a capacitance of two-hundred picofarads. An example of detector 52 is a photodiode that is capable of monitoring the levels of radiation received from X-ray source 24.

Channel 50 of DAS 30 includes a switching device 56 (e.g., a field effect transistor-based switching device) for alternatively coupling a temporary energy storage device 58 to either detector 52 (during a first portion of a time period) or an amplification device, such as a delta-sigma converter 60 (during a second portion of a time period). An example of a delta-sigma converter 60 is the subject of U.S. Pat. No. 6,252,531, entitled "Data acquisition system using delta-sigma analog-to-digital signal converters", which is hereby incorporated by reference into the subject application as if set forth herein in full. However, other delta-sigma-converters can be used. An example of temporary energy storage device 58 is a five picofarad capacitor, although other larger storage devices having larger capacitance values may be used, depending upon design considerations.

As with be discussed below in greater detail, switching device 56 is driven by a drive signal 62 that defines the above-referenced time period, and the first and second portions of the same.

As DAS 30 is typically a multi-channel DAS, DAS 30 typically includes additional channels (e.g., channels 64, 66, 68, 70; shown in phantom) for receiving analog data (e.g., analog current signal 72) from additional detectors (not shown). Each channel provides a digital data signal (e.g., digital data signal 74) to digital data sequencer 76, which combines the digital data signals from each channel to form composite data signal 78, which is representative of the combined digital channel data signals. Composite data signal 78 is provided to memory 32.

During operation of switching device 56, the first portion of the time period (i.e., when the switching device 56 couples detector 52 to energy storage device 58) should be sufficiently long enough to allow analog current signal 72 to adequately charge energy storage device 58, thus generating an input voltage signal across energy storage device 58 and maintaining the input of delta-sigma converter 60 above a ground state. Further, the second portion of the time period (i.e., when the switching device 56 couples energy storage device 58 to the input of delta-sigma converter 60) should be sufficiently long enough to allow energy storage device 58 to adequately discharge into the delta-sigma converter to which it is coupled.

For example, if the DAS is operating at 2.5 megahertz, the total time period is $\frac{1}{2,500,000}$ or 400 nanoseconds (i.e., $400 \times 10^{-9}$ seconds). The charging time (i.e., the values of the resistive and capacitive elements included in the charging path of each detector) is determined in accordance with the duration of the first portion of the time period (i.e., the charging period) and the second portion of the time period (i.e., the discharging period). For example, for a sampling rate of 2.5 megahertz and a temporary energy storage device 30 that has a capacitance of five picofarads, the first portion is typically set to fifty nanoseconds and the second portion is typically set to three-hundred-fifty nanoseconds, for a total time period of four-hundred nanoseconds.

Accordingly, in the example given above, if switching device 56 normally couples detector 52 and temporary energy storage device 58 when no drive signal is applied, the drive signal 62 applied to switching device 52 would typically be a 2.5 megahertz square wave signal having a duty cycle of 87.5%, such that switching device 56 is energized for 87.5% of four-hundred nanoseconds (i.e., the period of a 2.5 megahertz signal) and de-energized for 12.5% of four-hundred nanoseconds.

Through the use of switching device 56, the comparatively high capacitance detector 52 (i.e., typically having a capacitance in the range of 50–200 picofarads) can be effectively isolated from the amplification device (e.g., delta-sigma converter 60) by using a comparatively low capacitance temporary storage device (i.e., having a capacitance of five picofarads). As will be explained below, switching device 56 allows for a reduction in the gain-bandwidth product of the system by essentially a factor of: the capacitance 54 of the detector 52 divided by the capacitance of the energy storage device 58.

The gain-bandwidth product is the product of the gain of the system and the bandwidth of the system. For a system in which the gain is set equal to unity, the gain bandwidth product is simply the bandwidth of the system.

The time constant of a system is defined as follows:

$$\tau = R_{eq} C$$

where:

$$R_{eq} = \frac{1}{C_f * \omega_o} \text{ or } \frac{1}{C_f * 2\pi f_o}$$

Capacitance C is the sum of the capacitance of the energy storage device 58 and the feedback capacitance $C_f$ (typically 0.20 picofarads; not shown) of the first-stage of a typical delta-sigma converter 60. Accordingly, C is equal to the sum of 5.00 picofarads and 0.20 picofarads, or 5.20 picofarads.

Accordingly, substituting and solving for $f_0$ results in the following:

$$f_0 = \frac{(5.0 \times 10^{-12} + 0.20 \times 10^{-12})}{(0.20 \times 10^{-12})(2\pi)(\tau)}$$

To allow for adequate discharging of energy storage device 58, time constant $\tau$ is typically defined as 10% of the discharge portion of the time period. Accordingly, since the discharge portion of the time period is 350 nanoseconds, time constant $\tau$ is set equal to 35 nanoseconds. Inserting this values and solving for $f_0$ results in a gain bandwidth product of 118.23 megahertz.

For comparison purposes, if switching device 56 and temporary energy storage device 30 were removed from the system, the capacitance 54 of detector 52 would be coupled directly to delta-sigma converter 60. This, in turn, would result in C being equal to the sum of 50.00 picofarads and 0.20 picofarads (i.e., 50.20 picofarads), resulting in a much-higher gain bandwidth product of 1.14 gigahertz and a much higher per channel power consumption.

Figure 3:
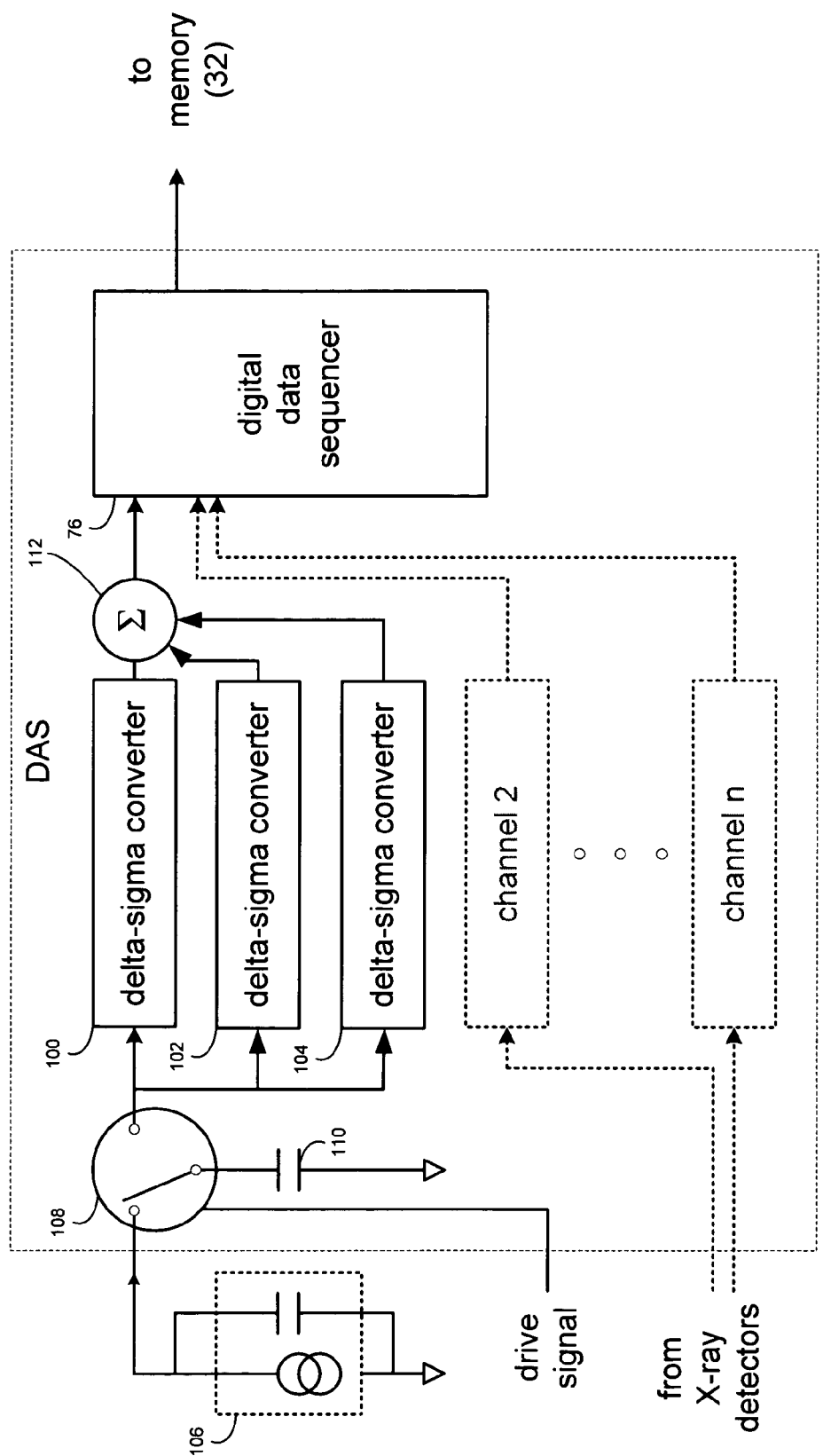
FIG. 3 is a block diagram of a multi-amplifier channel of a data acquisition system of the CT scanning system of FIG. 1.

As stated above, the presence of energy storage device 58 maintains a voltage differential between the input of the delta-sigma converter 60 and ground. Accordingly, as shown in FIG. 3, multiple delta-sigma converters 100, 102, 104 may be coupled to a single detector 106 through the use of a single switching device 108 and a single energy storage device 110, such that the signal output by each of the delta-sigma converters is summed by summer 112 prior to being provided to digital data sequencer 76.

Figure 4:
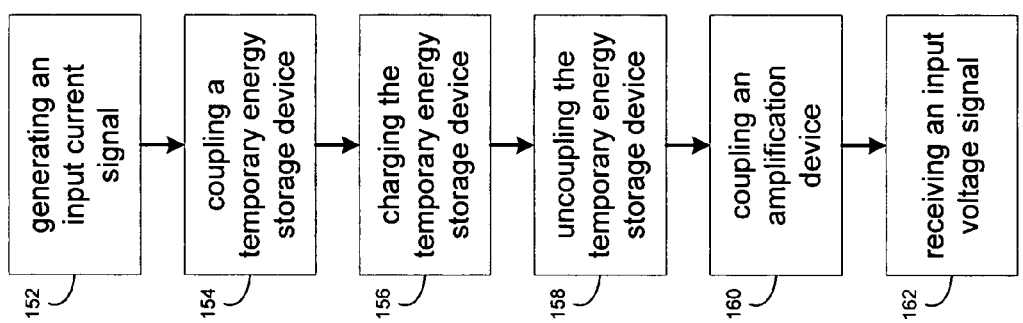
FIG. 4 is a flow chart of a method of reducing a gain-bandwidth product.

Referring to FIG. 4, there is shown a method 150 of reducing the gain-bandwidth product, which includes generating 152 an input current signal with a current-based input device. The current-based input device is coupled 154 to a temporary energy storage device. The temporary energy storage device is charged 156, during a first portion of a time period, with the input current signal to generate an input voltage signal. The current-based input device is uncoupled 158 from the temporary energy storage device, and the temporary energy storage device is coupled 160 to an amplification device. The amplification device receives 162, during a second portion of the time period, the input voltage signal.

While the system is described above as including a DAS that operates at 2.5 megahertz, this is for illustrative purposes only, as the clock speed of the DAS may vary in accordance with the individual design requirements of the system.

A number of implementations have been described. Nevertheless, it will be understood that various modifications may be made. Accordingly, other implementations are within the scope of the following claims.

What is claimed is:

1. A charge transfer system comprising:
   a current-based input device for generating an input current signal;
   a temporary energy storage device;
   an amplification device; and
   a switching device for (A) coupling the temporary energy storage device to the current-based input device during a first portion of a time period, and (B) uncoupling the temporary energy storage device from the current based input device and coupling the temporary input device to the amplification device during a second portion of a time period;
   wherein the input current signal charges the temporary energy storage device, during the first portion of the time period, to generate an input voltage signal;
   wherein the amplification device receives the input voltage signal during the second portion of the time period.

2. The system of claim 1 wherein the current-based input device is a photodiode.

3. The system of claim 2 wherein the photodiode is incorporated into a detector array of a computerized axial tomography scanner.

4. The system of claim 1 wherein the current-based input device is a high-capacitance input device.

5. The system of claim 4 wherein the high-capacitance input device has a capacitance in the range of 50–200 picofarads.

6. The system of claim 4 wherein the capacitance of the temporary energy storage device is less than the capacitance of the high-capacitance input device.

7. The system of claim 1 wherein the temporary energy storage device is a capacitor.

8. The system of claim 1 wherein the amplification device is a delta-sigma converter.

9. The system of claim 8 wherein the delta-sigma converter is incorporated into a computerized axial tomography scanner.

10. The system of claim 1 wherein the switching device is a solid-state switching device.

11. A charge transfer system comprising:
    a current-based input device for generating an input current signal;
    a temporary energy storage device;
    a first amplification device;
    a second amplification device; and
    a switching device for coupling the temporary energy storage device to the current-based input device during a first portion of a time period and to the amplification devices during a second portion of a time period;
    wherein the input current signal charges the temporary energy storage device, during the first portion of the time period, to generate an input voltage signal; and
    wherein each amplification device receives the input voltage signal during the second portion of the time period.

12. The system of claim 11 further comprising one or more additional amplification devices.

13. The system of claim 11 wherein the current-based input device is a photodiode that is incorporated into a detector array of a computerized axial tomography scanner.

14. The system of claim 13 wherein the capacitance of the temporary energy storage device is less than the capacitance of the photodiode.

15. The system of claim 11 wherein the temporary energy storage device is a capacitor.

16. The system of claim 11 wherein the amplification devices are delta-sigma converters.

17. The system of claim 11 wherein the switching device is a solid-state switching device.

18. A method of reducing the gain-bandwidth product, in a computerized axial tomography scanner, comprising:
   generating an input current signal with a current-based input device;
   coupling the current-based input device to a temporary energy storage device;
   charging the temporary energy storage device, during a first portion of a time period, with the input current signal to generate an input voltage signal;
   uncoupling the current-based input device from the temporary storage device;
   coupling the temporary energy storage device to an amplification device; and
   receiving on the amplification device, during a second portion of the time period, the input voltage signal.

19. The method of claim 18 wherein the current-based input device is a photodiode.

20. The method of claim 19 wherein the photodiode is incorporated into a detector array of a computerized axial tomography scanner.

21. The method of claim 18 wherein the current-based input device is a high-capacitance input device.

22. The method of claim 21 wherein the high-capacitance input device has an capacitance in the range of 50–200 picofarads.

23. The method of claim 21 wherein the capacitance of the temporary energy storage device is less than the capacitance of the high-capacitance input device.

24. The method of claim 18 wherein the temporary energy storage device is a capacitor.

25. The method of claim 18 wherein the amplification device is a delta-sigma converter.

26. The method of claim 25 wherein the delta-sigma converter is incorporated into a computerized axial tomography scanner.

27. The method of claim 18 wherein the switching device is a solid-state switching device.

* * * * *